United States Patent
Chang et al.

(10) Patent No.: US 7,651,367 B2
(45) Date of Patent: Jan. 26, 2010

(54) ELECTRICAL CONNECTOR WITH PRESSED PUSH ARMS EACH HAVING AN UPWARDLY TAPERED GUIDING FACE WITH AN EDGE BEHIND A LEDGE OF AN INNER SURFACE OF A SIDE WALL OF THE HOUSING

(75) Inventors: Chun-Yi Chang, Tu-cheng (TW); Fang-Chu Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/077,972

(22) Filed: Mar. 24, 2008

(65) Prior Publication Data
US 2008/0233788 A1 Sep. 25, 2008

(30) Foreign Application Priority Data
Mar. 23, 2007 (CN) .................. 2007 2 0035679

(51) Int. Cl.
*H05K 1/00* (2006.01)
(52) U.S. Cl. ..................................... 439/526
(58) Field of Classification Search ............... 439/66, 439/71, 72, 91, 564, 573, 525, 526; 361/810
See application file for complete search history.

(56) References Cited

U.S. PATENT DOCUMENTS

| 5,215,472 | A | * | 6/1993 | DelPrete et al. | ............... 439/71 |
| 5,221,209 | A | * | 6/1993 | D'Amico | ............... 439/71 |
| 6,132,220 | A | * | 10/2000 | McHugh et al. | ............. 439/526 |
| 6,164,980 | A | | 12/2000 | Goodwin | |
| 6,929,505 | B2 | * | 8/2005 | He et al. | ............... 439/526 |
| 2008/0304244 | A1 | * | 12/2008 | Hsieh | ............... 361/810 |

* cited by examiner

*Primary Examiner*—Chandrika Prasad
(74) *Attorney, Agent, or Firm*—Andrew C. Cheng; Wei Te Chung; Ming Chieh Chang

(57) ABSTRACT

An IC socket connector comprises a base and perimeter walls with corresponding inner sidewalls and outer sidewalls to form an inner cavity therebetween for receiving an IC package. An inner sidewall of the perimeter walls has a push arm at least which has an interfacing part between an inclined lead-in surface and a flat surface at the terminal end of the push arm. The distance from the interfacing part to the contact area is larger than the one from the corresponding inner sidewall to the contact area.

10 Claims, 6 Drawing Sheets

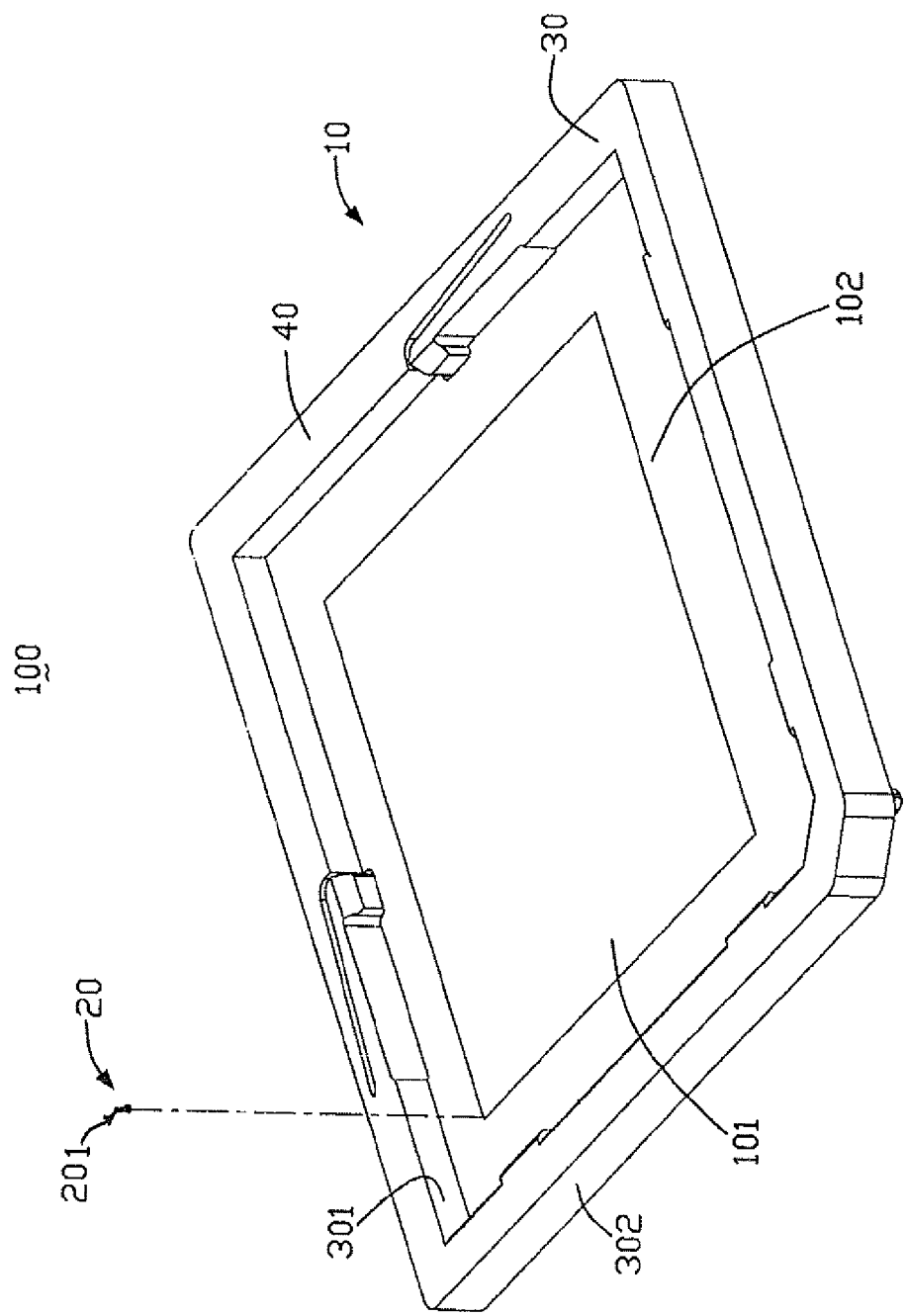

ELECTRICAL CONNECTOR WITH PRESSED PUSH ARMS EACH HAVING AN UPWARDLY TAPERED GUIDING FACE WITH AN EDGE BEHIND A LEDGE OF AN INNER SURFACE OF A SIDE WALL OF THE HOUSING

BACKGROUND OF THE INVENTION

1. Field of the Invention

The present invention generally relates to an IC socket, and more particularly to a housing of IC socket having push arms with improved configuration for preventing the push arm from break or deformation during assembly of the socket.

2. Description of Related Art

It is well known that an integrated circuit socket connector is widely used for coupling an IC package to a printed circuit board (PCB) together. The electrical connection between IC package and PCB is established by mounting the IC package in the electrical connector. The IC package has a plural of electrical pads to connect with contact terminals of the electrical connector. Unlike integrated circuit chips that are soldered directly on the printed circuit board, an integrated circuit chip that is mounted in a socket can be easily disconnected from the printed circuit board for testing and replacement. As the layout and contact terminals of integrated circuit become gradually denser and smaller, High-précised alignment is imperative both between the socket and the printed circuit, and between the integrated circuit and the socket.

The conventional electrical connector, like U.S. Pat. No. 6,164,980, disclosed a socket formed by a base and a frame enclosed by four perimeter walls. The base and perimeter walls define an inner cavity which involves a plurality of contact terminals and holes for fitting in with the corresponding contact terminals. For the reason of précised alignment between the integrated circuit and the socket, a first inner sidewall of the perimeter walls forms a contact point and the second inner sidewall adjacent to the first sidewall forms two contact points as well, in addition, each two spring members are respectively extended from the two remaining inner sidewalls. While an IC package is mounted in the socket, the IC package is aligned in a corner defined by the first inner sidewall and second inner sidewall, and oriented by the three alignment contact points. In the meantime, the four spring members may be employed to offer a first, second and third forces which are respectively perpendicular to the first inner sidewall and the second inner sidewall in order to establish more précised alignment between the IC package and the socket.

To more easily mounting the IC package into the socket, the spring members comprise an inclined lead-in surface adjacent to an flat surface at the terminal end of the spring members for having the socket slide into the socket. If the interface between the flat surface and the inclined lead-in surface exceeds the corresponding inner sidewall from which the spring members extends, the spring members made by elastic materials are likely to be directly pressed by the IC package due to the dislocation of mounting the IC package into the socket. Consequently, the IC package may exert a very high pressure on the spring members and possibly results in a situation of break or deformation of the spring members.

Therefore, it is desired to have a socket having push arms with improved configuration to solve the aforementioned problem.

BRIEF SUMMARY OF THE INVENTION

Accordingly, an object of the present invention is to provide a socket with recessed configuration of push arms for preventing the push arms from break or deformation during assembly of the socket.

In order to achieve the above-mentioned object, a base and a perimeter walls defining a inner cavity therebetween which receives the IC package above the base, the base occupying substantially an entire interior area between the perimeter walls and designated a region as a contact area, and a plural of conductive terminals and corresponding holes for fitting in with the contact terminals arranged in the contact area for forming a connection between the IC package and the printed circuit board;

Each of the perimeter walls having an inner sidewall and an outer sidewall, and at least one of the inner sidewalls has a push arm extending from the corresponding inner sidewall. The push arm substantially comprises three parts: a connecting part to which the corresponding inner sidewall extend, a torque part in the middle portion of the push arm and subsequently adjacent to the connecting part, and a contacting part at the terminal end of the spring member.

the contacting part further comprise an interfacing part which is between an inclined lead-in surface and an flat surface thereof, and the distance from the interfacing part to the contact area is no less than the distance from the corresponding inner sidewall to the contact area.

Other objects, advantages and novel features of the invention will become more apparent from the following detailed description of the present embodiment when taken in conjunction with the accompanying drawings.

BRIEF DESCRIPTION OF THE DRAWINGS

FIG. 1 is a three-dimensional view of an IC socket connector of the present invention;

DETAILED DESCRIPTION OF THE INVENTION

Figure 1A:
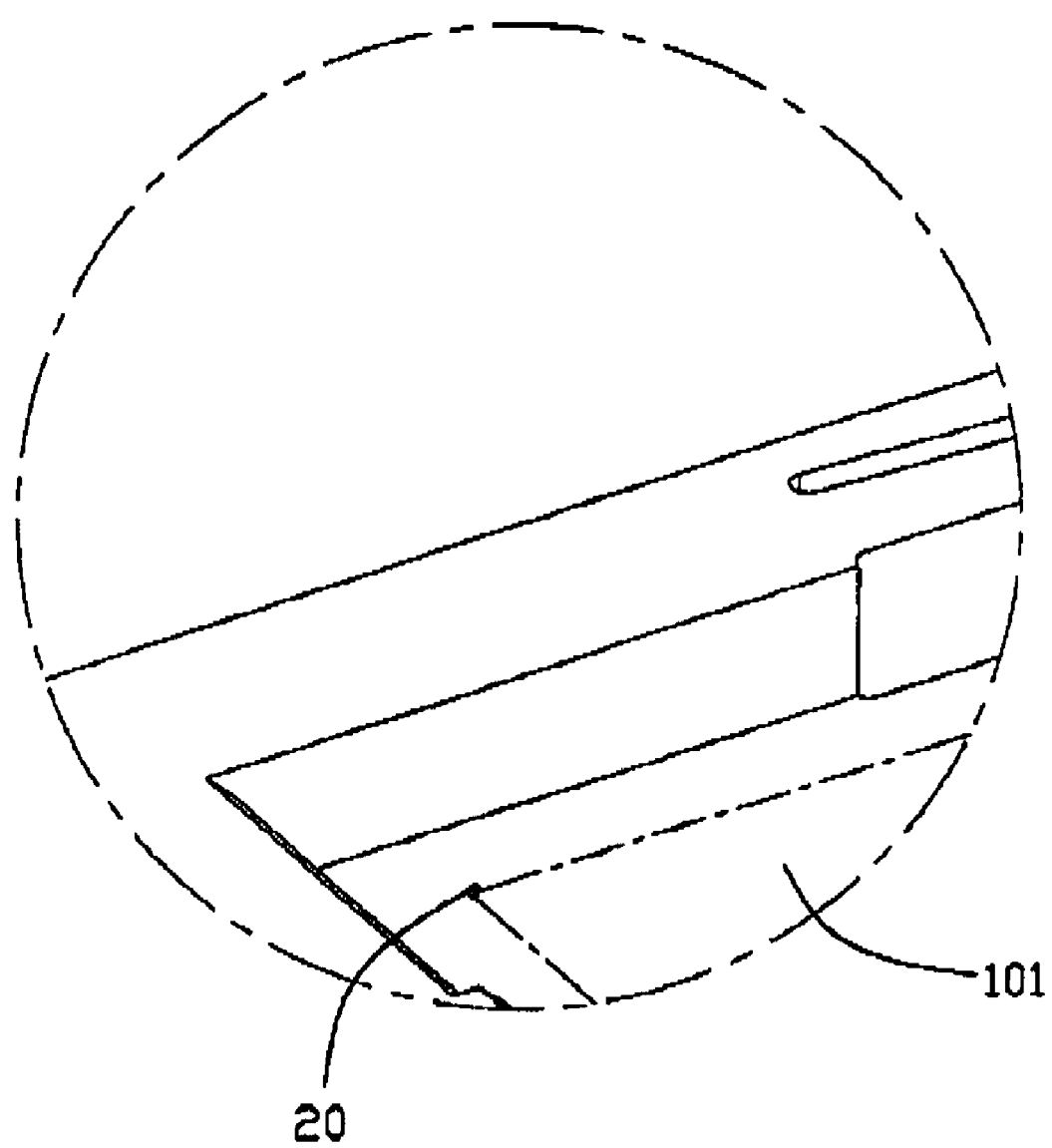
FIG. 1A is a partial enlarged perspective view of the electrical connector shown in FIG. 1 showing one of the contact attached to the insulative housing.

Reference will now be made to the drawing figures to describe the present invention in detail.

Figure 3:
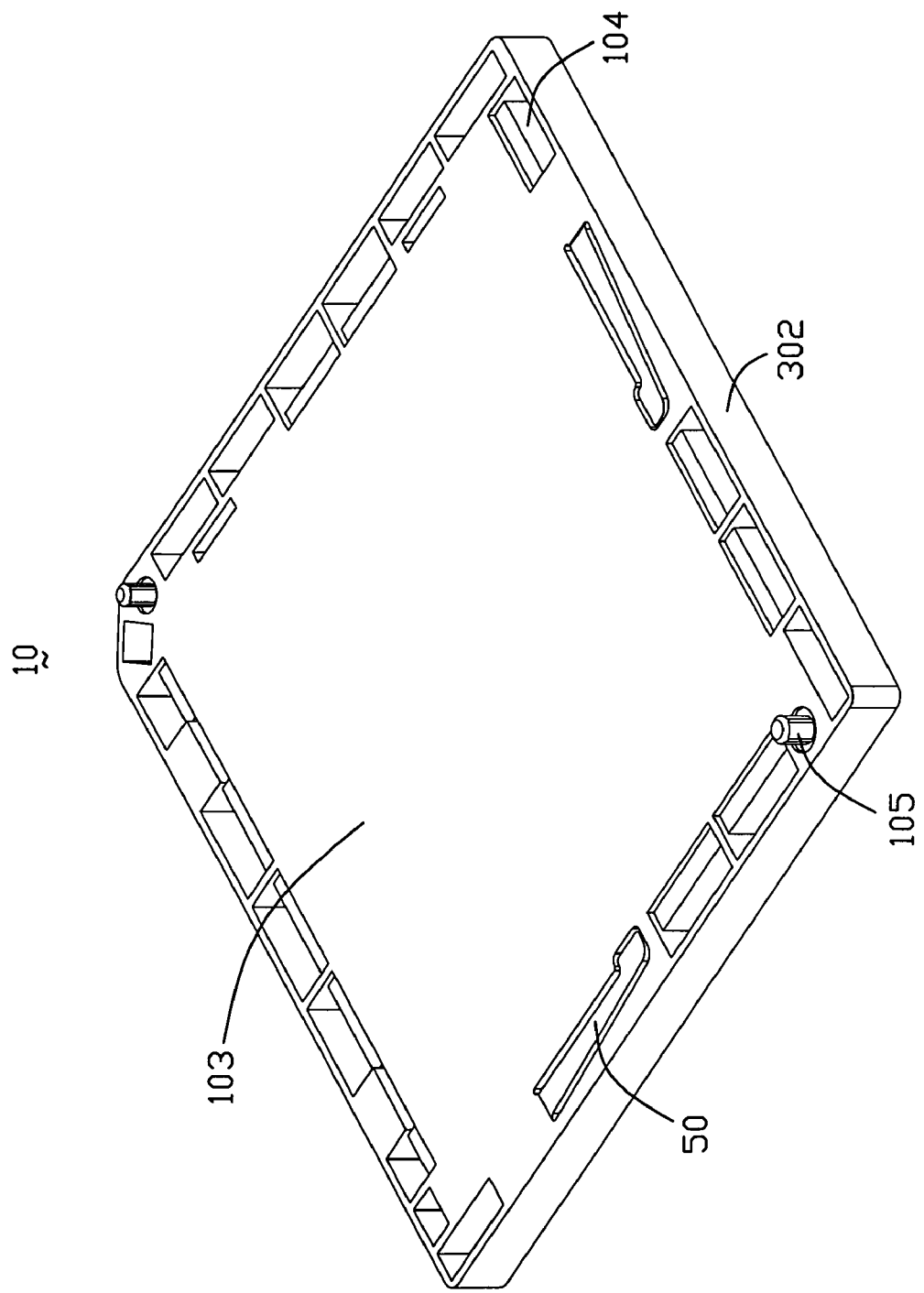
FIG. 3 is a backside view of the insulating housing of the present invention.

Referring to FIG. 1 and FIG. 3, an IC socket connector 100 in accordance with the preferred embodiment of the present invention includes a base 10 and a frame 40 formed by perimeter walls 30 defined a inner cavity 102 therebetween which receives the IC package (not shown) above the base. A region of the inner cavity 102 comprises a contact area 101 formed by a plurality of conductive terminals 20 with upwardly extending contacting sections 201 (only one shown) and a plurality of through holes (not shown) in which the conductive terminals involved. Each of perimeter walls 30 has an inner surface 301 and an outer surface 302. The rear surface 103 of the base 10 further comprises a plural of discrete slots 104 for saving cost and two raised columns 105 disposed in a manner of diagonal on the corner of rear surface 103 for aligning the IC socket connector 100 with a printed circuit board more precisely during assembly of the socket.

Figure 2:
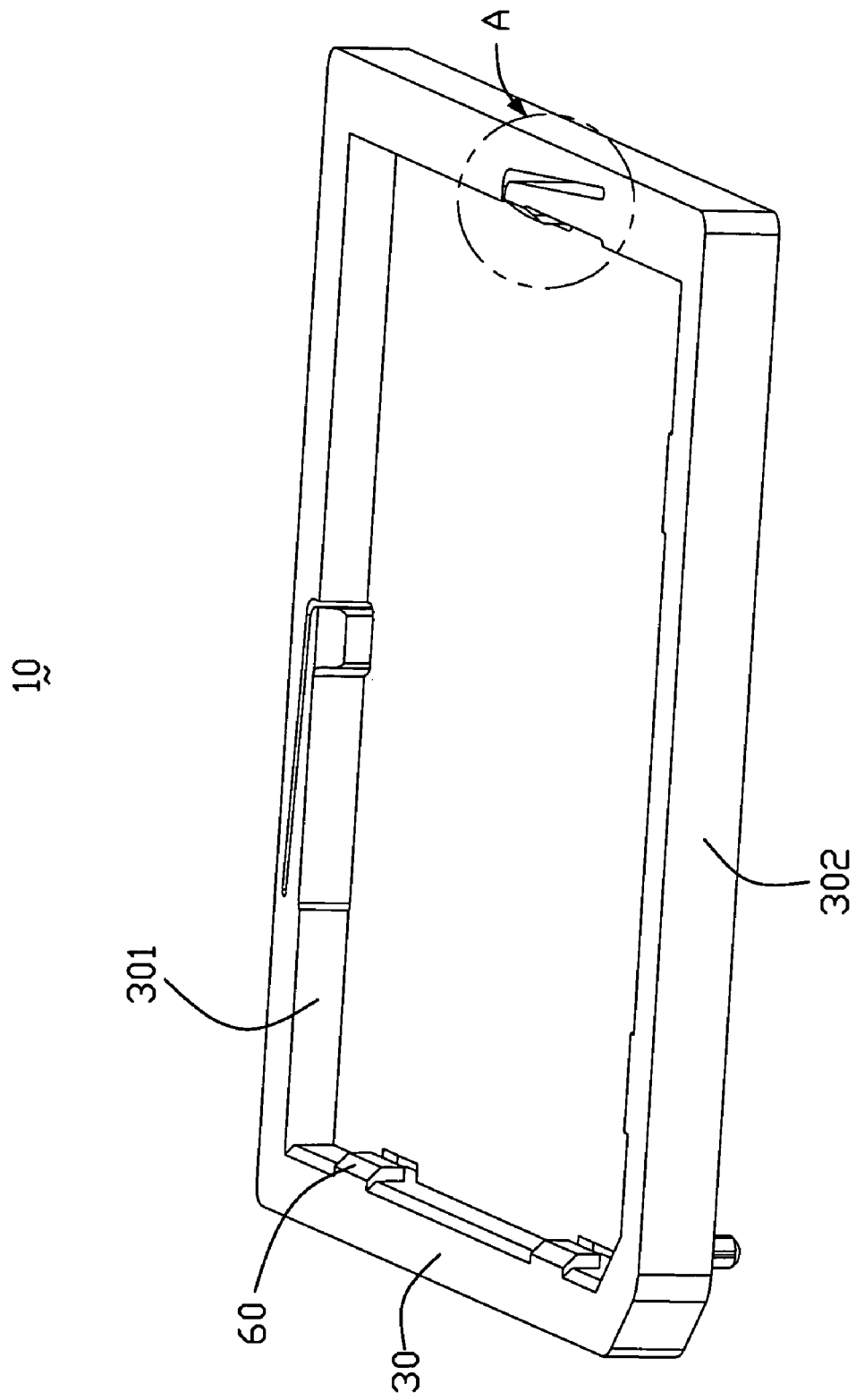
FIG. 2 is a three-dimensional view of an insulating housing of the present invention.

Furthermore, referring to FIGS. 1-3, the inner surface 301 of the perimeter walls 30 at least comprises either a push arm 50 or an aligned protrusion 60. During mounting the IC package on base 10, the push arm 50 offers a pushing force to push the IC package in a right position of the base 10 and the aligned protrusion 60 keeps the IC package in the right position after mounting the IC package on the base 10.

Figure 4:
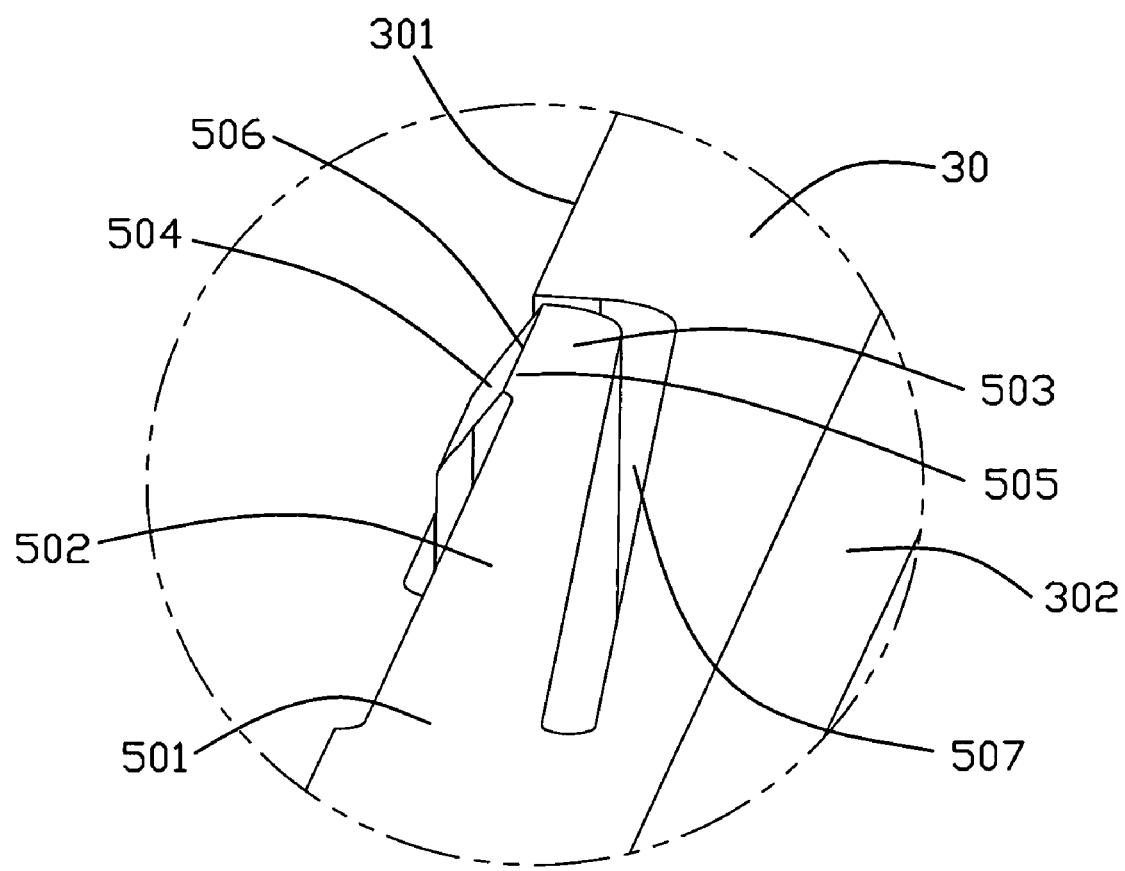
FIG. 4 is an enlarged view of location A of FIG. 2.
Figure 4A:
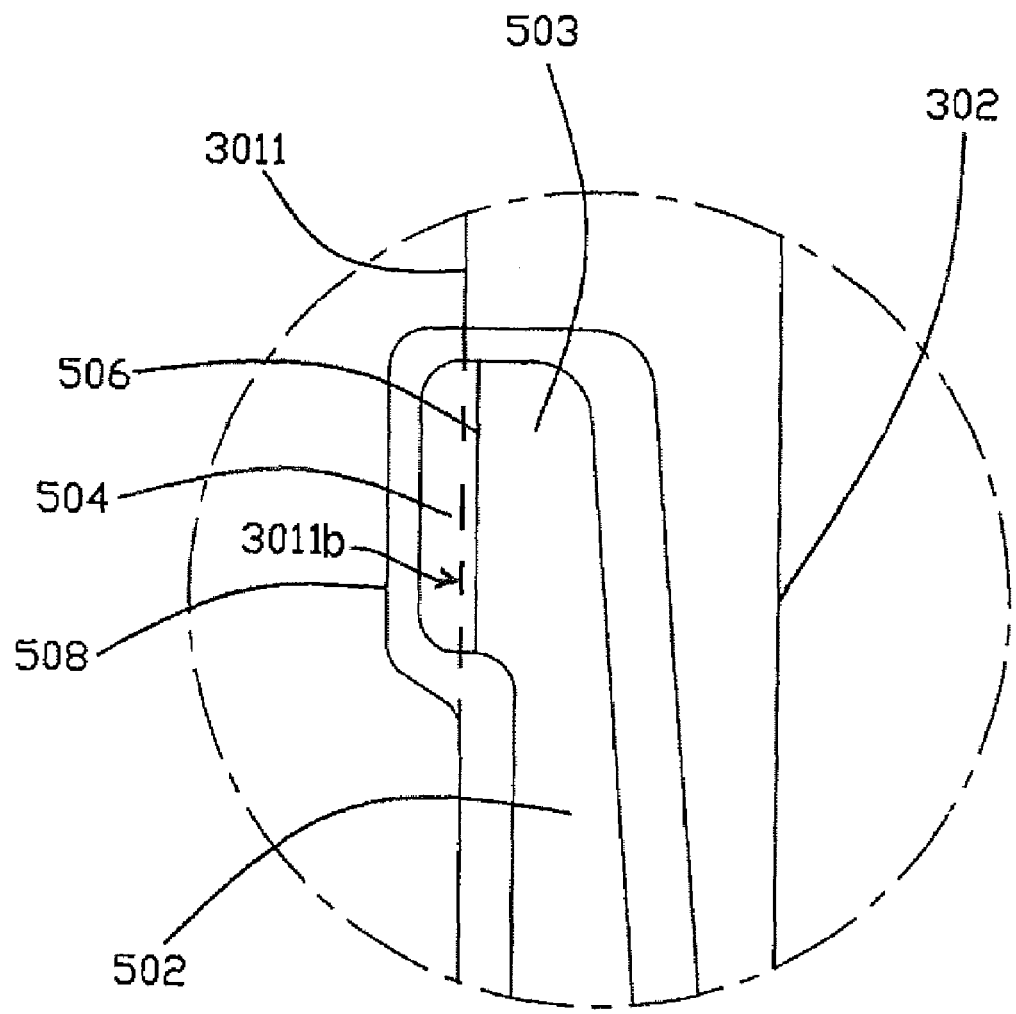
FIG. 4A is a top view of FIG. 4.

Referring FIG. 4, the location A is the zoom in view of the push arm 50 in FIG. 3. The push arm 50 comprises a connecting part 501 inwardly extending from the corresponding inner sidewall 301, a wedge-shaped torque part 502 subsequently adjacent to the connecting part 501 with a placement of approximately parallel to the inner sidewall 301 and an enlarged contacting part 503 at the terminal end of the push arm 50. The contacting part 503 is partially cut to form an inclined IC package lead-in surface 504 mainly facing to opposite inner sidewall 301, a flat upper surface 505 neighboring with the inclined lead-in surface 504, which substantially coplanar with a upper surface of the perimeter wall 30, and an interfacing part or ledge 506 between the inclined lead-in surface 504 and the upper surface 505. More importantly, there is a gap 507 between the push arm 50 and the inner surface 301 to which the push arm 50 extends with a width growing narrower gradually from the connecting part 501 to the contact part 503. A distance from the interfacing part 506 to the contact area 101 is larger than the distance from the inner surface 301 from which the corresponding spring members roots to the contact area 101. That is to say, the interfacing part 506 is closer to the corresponding outer surface 302 than the corresponding inner surface 301 is to the corresponding outer surface 302. The inner surface 301 has a ledge 3011 at a top thereof and the lead-in surface 504 extends across a line 3011b defined by the ledge 3011, as shown in a broken line in FIG. 4A, in a top view so that the lead-in surface 504 is pressed downwardly by the package, thus resulting in a lateral deflection of the push arm 50.

While the IC package is mounted to the IC socket connector 100, the IC package is firstly placed above the inner cavity 102, then one end of the IC package is embedded into one side of the perimeter walls 30. After that, the IC package is pressed downwardly to force the contacting part 503 with the inclined lead-in surfaces 504 back. Because the wedge-shaped torque part 502 of the push arm 50 is floating, the wedge-shaped torque part 502 induces an elastic force to push the free moving part of the push arm 50 to move outwardly in the gap 507 while the wedge-shaped torque part 502 sustains a pressure resulting from the force of the IC package exerted by user. As a result, the whole IC package slides into the base 10 aligning with the inclined lead-in surface 504 according to aforementioned mechanism. As soon as the whole IC package embedded into the base 10, the push arms 50 closely compress the IC package by releasing the elastic forces of the push arms 50 and embed the IC package in a right position cooperated with the aligned protrusions 60.

With the aforementioned design, the IC package will press on the inner surface 301 in advance if dislocation of IC package assembly happened. In other words, because the interface ledge 506 is essentially located offset behind from the inner surface 301 and the lead-in surface 504 extends across the inner side wall, downward loading of the electronic package guarantees only confrontation with the lead-in surface 504 without possibility of the upper surface 505 instead, thus assuring any downward force will absolutely result in a lateral/outward force for activating lateral deflection of the push arm 50. Therefore, the IC package will not directly impose, only in a downward direction, too much improper downward forces on the push arms 50 so as to prevent the push arm 50 from breakage or deformation caused by the improper pressure of the IC package exerted by user. In addition, the man skilled in the art can adjust the interfacing part 506 to align with the inner surface 301 in order to achieve the same purpose.

While the present invention has been described with reference to preferred embodiments, the description of the invention is illustrative and is not to be construed as limiting the invention. Various modifications to the present invention can be made to preferred embodiments by those skilled in the art without departing from the true spirit and scope of the invention as defined by the appended claims.

What is claimed is:

1. A socket for use with an electron package, comprising:
   an insulative housing including a base with a plurality of side walls commonly defining a package receiving cavity;
   a plurality of contacts disposed in the base; and
   at least one resilient arm located on one of said side walls and defining an engagement head thereof for engagement with said electronic package received in the package receiving cavity, said engagement head defining an inward engagement face facing the electronic package cavity for engagement with the package, and an upwardly tapered guiding face adjacent to the engagement face for guiding downward loading of the package into the package receiving cavity; wherein
   said one of the side walls defines an inner surface with a ledge at a top, and said upwardly tapered guiding face extends across a line defined by said ledge in a top view so that the guiding face is assured to be confronted by the package when the package is downwardly loaded into the package receiving cavity, thus resulting in a lateral deflection of the resilient arm.

2. The socket as claimed in claim 1, wherein said resilient arm is unitarily formed with the housing.

3. The socket as claimed in claim 1, where a gap is formed between the resilient am and said one of the side walls under a condition that said gap is dimensioned to be large enough to allow lateral deflection of the resilient arm when said engagement face is outwardly pushed by the electronic package.

4. The socket as claimed in claim 3, wherein said gap is dimensioned to allow lateral deflection of the resilient arm when said engagement face is coplanar with the inner surface.

5. The socket as claimed in claim 1, wherein said engagement head is located at a free end of said resilient arm.

6. A socket for use with an electronic package, comprising:
   an insulative housing including a base with a plurality of side walls commonly defining a package receiving cavity;
   a plurality of contacts disposed in the base; and
   at least one resilient aim located on one of said side walls and defining an engagement head thereof for engagement with said electronic package received in the package receiving cavity, said engagement head defining an inward engagement face facing the electronic package cavity for engagement with the package, and an upwardly tapered guiding face adjacent to the engagement face for guiding downward loading of the package into the package receiving cavity; wherein
   said one of the side walls defines an inner surface with a ledge at a top, and a top edge of said guiding face is offset behind from the ledge in a top view so that the guiding face is assured to be confronted by the package when the package is downwardly loaded into the package receiving cavity, thus resulting in a lateral deflection of the resilient aim.

7. The socket as claimed in claim 6, wherein said resilient arm is unitarily formed with the housing.

8. The socket as claimed in claim 6, where a gap is formed between the resilient am and said one of the side walls under a condition that said gap is dimensioned to be large enough to allow lateral deflection of the resilient arm when said engagement face is outwardly pushed by the electronic package.

9. The socket as claimed in claim 8, wherein said gap is dimensioned to allow the lateral deflection of the resilient arm when said engagement face is coplanar with the inner surface.

10. The socket as claimed in claim 6, wherein said engagement head is located at a free end of said resilient arm.

* * * * *